(12) United States Patent
Takeda et al.

(10) Patent No.: US 7,750,458 B2
(45) Date of Patent: Jul. 6, 2010

(54) LIGHT SOURCE MODULE AND LIGHTING DEVICE FOR A VEHICLE

(75) Inventors: Hitoshi Takeda, Shizuoka (JP); Tsukasa Tokida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 330 days.

(21) Appl. No.: 11/712,788

(22) Filed: Mar. 1, 2007

(65) Prior Publication Data

US 2007/0206369 A1  Sep. 6, 2007

(30) Foreign Application Priority Data

Mar. 6, 2006  (JP) ............... 2006-059269

(51) Int. Cl.
*H01L 23/48* (2006.01)
(52) U.S. Cl. ............ 257/690; 257/692; 257/693; 257/698
(58) Field of Classification Search ........... 257/690, 257/692, 693, 698
See application file for complete search history.

(56) References Cited

U.S. PATENT DOCUMENTS

| 7,201,506 | B2 | 4/2007 | Ishida et al. |
| 7,210,834 | B2 | 5/2007 | Sazuka et al. |
| 7,290,913 | B2 | 11/2007 | Watanabe et al. |

FOREIGN PATENT DOCUMENTS

| DE | 10 2004 036157 A1 | 2/2006 |
| EP | 1 367 870 A | 12/2003 |
| EP | 1 598 593 A | 11/2005 |
| FR | 2 865 524 A | 7/2005 |
| JP | 2004-006364 A | 1/2004 |
| JP | 2005-044699 A | 2/2005 |

(Continued)

OTHER PUBLICATIONS

Chinese Office Action issued in Chinese Application No. 200710126612.5 dated Jul. 25, 2008 and English translation thereof, 20 pages.
European Search Report issued in European Application No. EP 07 10 3451 dated Oct. 15, 2008, 7 pages.

(Continued)

*Primary Examiner*—Long Pham
(74) *Attorney, Agent, or Firm*—Osha • Liang LLP

(57) ABSTRACT

A light source module includes a ceramic circuit board having a predetermined conductive pattern, a semiconductor light emitting element arranged on said ceramic circuit board and connected to the conductive pattern, and an attachment for power feeding bonded to the ceramic circuit board. The attachment for power feeding is provided with a power feeding part connected to an external power source, a plate-shaped part adjacent to a position opposed to an outer circumferential surface of the ceramic circuit board, and a power feeding terminal formed in plate shape and protruded from the plate-shaped part to a side of the ceramic circuit board. The top of the power feeding terminal is connected to a part of the conductive pattern with the top overlapped from a thickness direction. The power feeding terminal of the attachment for power feeding is fixed and connected to the conductive pattern of the ceramic circuit board.

20 Claims, 7 Drawing Sheets

FOREIGN PATENT DOCUMENTS

| | | |
|---|---|---|
| JP | 2005-44777 | 2/2005 |
| JP | 2005-141917 A | 6/2005 |
| JP | 2005-209538 A | 8/2005 |
| WO | 2005/048422 A1 | 5/2005 |

OTHER PUBLICATIONS

Office Action in Japanese Patent Application No. 2006-059269 mailed Nov. 19, 2009 with English translation, 6 pages.

English Patent Abstract of JP2005209538 from esp@cenet, published Aug. 4, 2005, 1 page.

LIGHT SOURCE MODULE AND LIGHTING DEVICE FOR A VEHICLE

BACKGROUND OF INVENTION

1. Field of the Invention

The present invention relates to a light source module and a lighting device for a vehicle.

2. Background Art

There is a light source module using a semiconductor light emitting element such as a light emitting diode (LED) as a light source (for example, see Patent Reference 1) and, for example, a lighting device for a vehicle in which light emitted from a light source is applied as illumination light by a projection lens is equipped with such a light source module.

In the light source module described in Patent Reference 1, for example, a light emitting diode is mounted on a conductive pattern of a circuit board and the circuit board is attached to an attachment for power feeding. The circuit board is fixed to the attachment for power feeding by a fixing member (an elastic member 503 in Patent Reference 1) and the attachment for power feeding to which the circuit board is fixed is fitted into a radiator of a bracket etc.

The attachment for power feeding is provided with a power feeding terminal connected to the conductive pattern of the circuit board, and the power feeding terminal is connected to a power feeding part (a connector part) disposed in the attachment for power feeding. By connecting an external power source to the power feeding part, a power source is supplied to the light emitting diode through the external power source, the power feeding part, the power feeding terminal, and the conductive pattern.

[Patent Reference 1] JP-A-2005-44777

However, in the conventional light source module described above, there is a problem of a large number of components required by the presence of a fixing member because the circuit board is fixed to the attachment for power feeding using the fixing member.

SUMMARY OF INVENTION

One or more embodiments of the present invention reduce the number of components required in a light source module and lighting device for a vehicle. In one or more embodiments, a light source module and a lighting device for a vehicle are provided with a ceramic circuit board on which a predetermined conductive pattern is formed, a semiconductor light emitting element which is arranged on the ceramic circuit board and is connected to the conductive pattern, and an attachment for power feeding bonded to the ceramic circuit board on which the semiconductor light emitting element is arranged, and are constructed so that the attachment for power feeding is provided with a power feeding part connected to an external power source, a plate-shaped part which is adjacent to a position opposed to an outer circumferential surface of the ceramic circuit board, and a power feeding terminal which is formed in plate shape and also is protruded from the plate-shaped part to the side of the ceramic circuit board, the top of the power feeding terminal being connected to a part of the conductive pattern with the top overlapped from a thickness direction, and the power feeding terminal of the attachment for power feeding is fixed and connected to the conductive pattern of the ceramic circuit board by welding.

Therefore, in the light source module and the lighting device for a vehicle of the invention, the ceramic circuit board is fixed to the attachment for power feeding by welding.

A light source module in accordance with one or more embodiments of the invention is a light source module which is used in a lighting device for vehicle and is fitted into a radiator, and comprises a ceramic circuit board on which a predetermined conductive pattern is formed, a semiconductor light emitting element which is arranged on the ceramic circuit board and is connected to the conductive pattern, and an attachment for power feeding bonded to the ceramic circuit board on which the semiconductor light emitting element is arranged, and is characterized by being constructed so that the attachment for power feeding is provided with a power feeding part connected to an external power source, a plate-shaped part which is adjacent to a position opposed to an outer circumferential surface of the ceramic circuit board and is formed by a resin material, and a power feeding terminal which is formed in plate shape and also is protruded from the plate-shaped part to the side of the ceramic circuit board, the top of the power feeding terminal being connected to a part of the conductive pattern with the top overlapped from a thickness direction, and the power feeding terminal of the attachment for power feeding is fixed and connected to the conductive pattern of the ceramic circuit board by welding.

Therefore, a dedicated fixing member for fixing the ceramic circuit board to the attachment for power feeding is not required and the number of components can be reduced.

In one or more embodiments, the ceramic circuit board and the plate-shaped part of the attachment for power feeding are formed in a substantially same thickness and the power feeding terminal is protruded from a side surface of the plate-shaped part located opposite to an outer circumferential surface of the ceramic circuit board and the power feeding terminal is bent in crank shape in a thickness direction of the ceramic circuit board, so that the plate-shaped part can be arranged in a position in which light emitted from the semiconductor light emitting element is not blocked, and an irradiation range of the light emitted from the semiconductor light emitting element is increased and light emission efficiency can be improved.

In one or more embodiments, it is constructed so that when a position in a thickness direction of the ceramic circuit board of a surface connected to the conductive pattern of the power feeding terminal is set as a position A and a position in the thickness direction of the ceramic circuit board of a surface opposite to the surface connected to the conductive pattern of the power feeding terminal is set as a position B and a position in the thickness direction of the ceramic circuit board of a surface facing in the same direction as the opposite surface of the plate-shaped part of the attachment for power feeding is set as a position C, the position C is present in the same position as the position B or the position C is present in the side of the position A beyond the position B, so that light emission efficiency of light emitted from the semiconductor light emitting element can be improved surely.

In one or more embodiments, the plate-shaped part of the attachment for power feeding is formed by a resin material and the plate-shaped part and the power feeding terminal are formed by integral molding, so that molding of the attachment for power feeding can be facilitated and also position accuracy of a power feeding part and a connection terminal can be improved.

In one or more embodiments, laser welding is used as welding between the power feeding terminal of the attachment for power feeding and the conductive pattern of the ceramic circuit board, so that welding operation can be performed in a short time and manufacturing cost of the light source module can be reduced.

A lighting device for vehicle of the invention is a lighting device for vehicle in which light emitted from a semiconductor light emitting element of a light source module arranged inside a lamp housing is applied as illumination light by a projection lens, and is characterized in that the light source module comprises a ceramic circuit board on which a predetermined conductive pattern is formed, a semiconductor light emitting element which is arranged on the ceramic circuit board and is connected to the conductive pattern, and an attachment for power feeding bonded to the ceramic circuit board on which the semiconductor light emitting element is arranged, and it is constructed so that the attachment for power feeding is provided with a power feeding part connected to an external power source, a plate-shaped part which is adjacent to a position opposed to an outer circumferential surface of the ceramic circuit board and is formed by a resin material, and a power feeding terminal which is formed in plate shape and also is protruded from the plate-shaped part to the side of the ceramic circuit board, the top of the power feeding terminal being connected to a part of the conductive pattern with the top overlapped from a thickness direction, and the power feeding terminal of the attachment for power feeding is fixed and connected to the conductive pattern of the ceramic circuit board by welding.

Therefore, a dedicated fixing member for fixing the ceramic circuit board to the attachment for power feeding is not required and the number of components can be reduced.

Other aspects and advantages of the invention will be apparent from the following description and the appended claims.

DETAILED DESCRIPTION

A light source module and a lighting device for a vehicle in accordance with embodiments of the invention will be described below with reference to the accompanying drawings.

Figure 1:
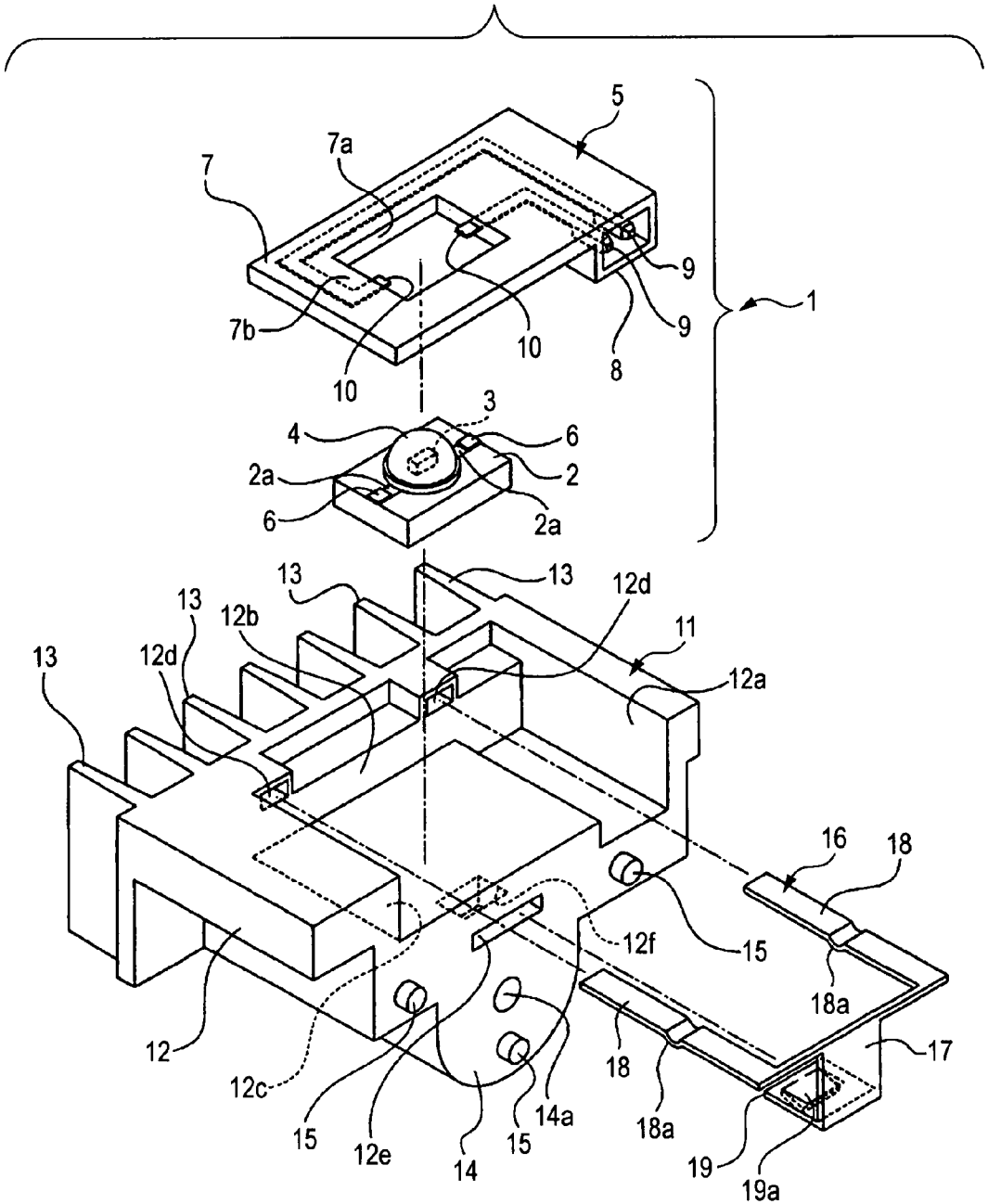
FIG. 1 shows the best mode of the invention together with FIGS. 2 to 9, and is an exploded perspective view showing a light source module, a radiator and a clip.

A light source module 1 comprises a ceramic circuit board 2, a semiconductor light emitting element 3 such as an LED (light emitting diode) chip, a cover 4 and an attachment 5 for power feeding (see FIG. 1).

As the ceramic circuit board 2, for example, various boards such as an aluminum nitride board, an alumina board, a mullite board or a glass ceramic board are used. A pair of conductive patterns 2a, 2a extending from the center to the side edges opposite mutually are formed on the ceramic circuit board 2.

Metal pads 6, 6 are respectively joined to the ends located in each of the outsides of the conductive patterns 2a, 2a of the ceramic circuit board 2. Since the metal pads 6, 6 are fixed by welding to connection terminals (described below) of the attachment 5 for power feeding, the metal pads are formed by a metal material suitable for welding. Also, since the metal pads 6, 6 are joined to the ceramic circuit board 2, the metal pads are formed by a material having a linear expansion coefficient close to that of the ceramic circuit board 2. Therefore, the metal pads 6, 6 are formed by, for example, an alloy of iron and nickel or an alloy of iron, nickel and cobalt.

In addition, in the metal pads 6, 6, surface treatment may be performed by, for example, nickel or tin in order to prevent corrosion of the metal pads.

The metal pads 6, 6 are respectively joined to the conductive patterns 2a, 2a by a predetermined joint material. As the joint material, a material with good heat resistance is used in order to improve reliability of welding to the connection terminals of the attachment 5 for power feeding. Therefore, as the joint material, for example, solder of gold-tin or silver solder of silver-copper, silver-copper-titanium, silver-copper-tin, silver-copper-indium, etc. are used.

As the semiconductor light emitting element 3, for example, a light emitting diode to which a fluorescent substance is applied in uniform film shape is used. The semiconductor light emitting element 3 is arranged on the ceramic circuit board 2 through a sub-mount astride the conductive patterns 2a, 2a or in a state astride the conductive patterns 2a, 2a.

An outer surface of the cover 4 is formed in substantially hemispherical shape and the cover 4 is joined to an upper surface of the ceramic circuit board 2 so as to cover the semiconductor light emitting element 3. The semiconductor light emitting element 3 is arranged in a hollow hermetically-sealed region inside the cover 4 by joining the cover 4 to the ceramic circuit board 2.

The attachment 5 for power feeding has a base surface part 7 with substantially flat plate shape facing a vertical direction in which each part excluding a conduction part is integrally formed by a resin material, and a protrusion part 8 downward protruded from one end of the base surface part 7.

An arrangement hole 7a having substantially rectangular shape is formed in the base surface part 7. An inner circumferential part of the base surface part 7 is disposed as a plate-shaped part 7b formed in flat plate shape.

The protrusion part 8 is provided with power feeding parts 9, 9. The power feeding parts 9, 9 are, for example, connector terminals connected to an external power source.

Since the attachment 5 for power feeding is fixed to the ceramic circuit board 2 which is a heat generation component, the base surface part 7 and the protrusion part 8 require heat resistance with at least 150° C. or higher. Therefore, the base surface part 7 and the protrusion part 8 are formed by, for example, a polyester resin (polypropylene terephthalate, polyphenylene sulfate, polybutylene terephthalate, etc.) or a nylon resin (nylon 6 etc.) which is a resin with high heat resistance.

The attachment 5 for power feeding is provided with power feeding terminals 10, 10. The power feeding terminals 10, 10 are formed in, for example, flat plate shape and one ends of the power feeding terminals are protruded in directions moving closer to each other in the arrangement hole 7a from an inner circumferential surface of the attachment 5 for power feeding and the other ends are respectively connected to the power feeding parts 9, 9. The power feeding terminals 10, 10 are formed integrally with the base surface part 7 and the protrusion part 8 together with the power feeding parts 9, 9 by, for example, insert molding. By integrally forming the base surface part 7, the protrusion part 8, the power feeding parts 9, 9 and the power feeding terminals 10, 10 by the insert molding, molding of the attachment 5 for power feeding can be facilitated and also the positional accuracy of the power feeding parts 9, 9 and the power feeding terminals 10, 10 with respect to the protrusion part 8, and the base surface part 7 can be improved.

The power feeding terminals 10, 10 are formed integrally with the power feeding parts 9, 9 by the same material. The power feeding terminals 10, 10 are fixed to the metal pads 6, 6 by, for example, laser welding. Therefore, the power feeding terminals 10, 10 are formed by a material with high absorptance of laser light, for example, a material of phosphor bronze, brass or iron.

The power feeding terminals 10, 10 of the attachment 5 for power feeding are fixed to the metal pads 6, 6 of the ceramic circuit board 2 by welding, for example, laser welding or resistance welding and the light source module 1 is constructed. Particularly, by fixing the power feeding terminals 10, 10 to the metal pads 6, 6 by laser welding, both can be fixed in a short time and manufacturing cost of the light source module 1 can be reduced.

By fixing the power feeding terminals 10, 10 to the metal pads 6, 6, the semiconductor light emitting element 3 is electrically connected to the power feeding parts 9, 9 through the conductive patterns 2a, 2a, the metal pads 6, 6 and the power feeding terminals 10, 10.

The light source module 1 constructed as described above is fitted into a radiator 11 (see FIGS. 1 and 2). The radiator 11 is fixed to, for example, a bracket arranged inside a vehicle body.

The radiator 11 is constructed by integrally forming each part by a metal material etc. with high heat conductivity, and comprises a base part 12, radiating fins 13, 13, . . . backward protruded from the base part 12 and a fitting protrusion part 14 downward protruded from the base part 12 as shown in FIG. 1.

An arrangement recess part 12a opened forward and upward is formed in the base part 12. Surfaces of the arrangement recess part 12a facing to the front and the right are respectively formed as positioning surfaces 12b, 12c.

Insertion holes 12d, 12d separated right and left are formed in the back end of the base part 12. An insertion hole 12e for fitting is formed in a front surface of the base part 12, and an engagement hole 12f opened forward is formed inside the insertion hole 12e for fitting. Positioning protrusion parts 15, 15 forward protruded are separated right and left and are disposed on the front surface of the base part 12.

The radiating fins 13, 13, . . . are disposed at equal spacing to be separated right and left.

The fitting protrusion part 14 is provided with a positioning protrusion part 15 forward protruded. A screw insertion hole 14a penetrated backward and forward is formed in the fitting protrusion part 14.

The light source module 1 is fixed to the radiator 11 by a clip 16.

The clip 16 is constructed by integrally forming each part by a plate-shaped metal material having resilience (see FIG. 1). The clip 16 comprises a coupling part 17 facing in backward and forward directions, press protrusion parts 18, 18 respectively backward protruded from the upper edge of the coupling part 17 and an insertion protrusion part 19 backward protruded from the lower edge of the coupling part 17.

The press protrusion parts 18, 18 are respectively backward protruded from both ends of the right and left of the coupling part 17, and have engagement protrusion stripes 18a, 18a respectively downward protruded at the intermediate part in a protrusion direction. The engagement protrusion stripes 18a, 18a are formed so as to extend to the right and left.

A notched engagement protrusion piece 19a is formed in the insertion protrusion part 19 and the engagement protrusion piece 19a is notched so as to protrude in a front oblique lower direction.

A procedure for fixing the light source module 1 to the radiator 11 will be described below.

First, the light source module 1 is arranged in the arrangement recess part 12a, and a back surface and a left side surface of the ceramic circuit board 2 are respectively pushed on the positioning surfaces 12b, 12c and positioning of the light source module 1 with respect to the radiator 11 is performed. The bottom of the ceramic circuit board 2 is brought into surface contact with the base part 12.

Next, the press protrusion parts 18, 18 of the clip 16 are respectively inserted into the insertion holes 12d, 12d of the radiator 11 from the front and also the insertion protrusion part 19 of the clip 16 is inserted into the insertion hole 12e for fitting of the radiator 11 from the front. The engagement protrusion stripes 18a, 18a of the press protrusion parts 18, 18 are respectively engaged with an upper surface of the attachment 5 for power feeding by respectively inserting the press protrusion parts 18, 18 and the insertion protrusion part 19. At this time, the engagement protrusion piece 19a of the insertion protrusion part 19 is brought into slide contact with a wall surface (lower surface) forming the insertion hole 12e for fitting and is elastically deformed and then at the time of positioning the front end of the engagement protrusion piece 19a to an upper portion of the engagement hole 12f, the engagement protrusion piece 19a elastically returns and its front edge engages with the front side opening edge of the engagement hole 12f. Therefore, the clip 16 is fitted into the radiator 11.

Figure 2:
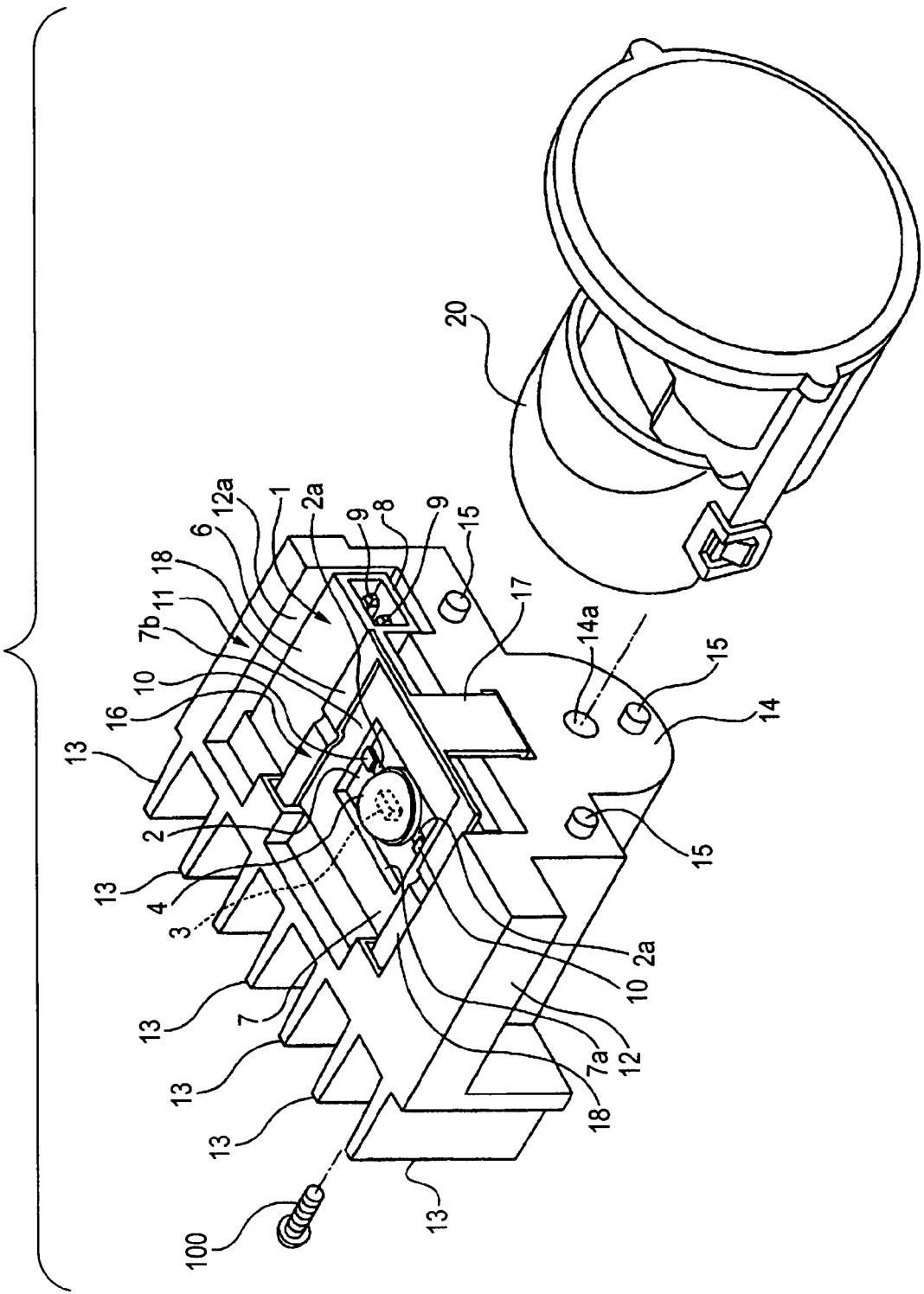
FIG. 2 is an exploded perspective view showing a state that the light source module is fixed to the radiator by the clip together with an optical component.

In a state that the fitting the clip 16 is fixed into the radiator 11 as described above, by resilience of the press protrusion parts 18, 18 and the insertion protrusion part 19, energization force in directions in which the both move closer to each other is generated and the ceramic circuit board 2 is pushed on an upper surface of the base surface part 7 and the light source module 1 is fixed to the radiator 11 (see FIG. 2).

A connector of a power source cord (not shown) connected to an external power source is connected to the power feeding parts 9, 9 of the attachment 5 for power feeding in a state that the light source module 1 is fixed to the radiator 11.

In the state that the light source module 1 is fixed to the radiator 11 by the clip 16 as described above, an optical component 20 is arranged in the front of the radiator 11 (see FIG. 2). The optical component 20 is arranged in the front of the radiator 11 with being positioned by being abutted on the positioning protrusion parts 15, 15, 15 of the radiator 11.

A screw stop hole (not shown) opened backward is formed in the optical component 20. The optical component 20 is fixed to the radiator 11 by screwing a fastening screw 100 inserted in the screw insertion hole 14a of the radiator 11 from the back into the screw stop hole.

As described above, in the light source module 1, the ceramic circuit board 2 is fixed to the attachment 5 for power feeding by welding, so that while the conductive patterns 2a, 2a are connected to the power feeding terminals 10, 10, the ceramic circuit board 2 is fixed to the attachment 5 for power feeding, and a dedicated fixing member for fixing the ceramic circuit board 2 to the attachment 5 for power feeding is not required so that the number of components can be reduced.

Also, the conductive patterns 2a, 2a of the ceramic circuit board 2 are respectively fixed to the power feeding terminals 10, 10 of the attachment 5 for power feeding through the metal pads 6, 6 by welding. Therefore, for example, in a conventional structure of pushing the power feeding terminals on the conductive patterns 2a, 2a by resilience of a spring, plating treatment of the power feeding terminals by an expensive gold material is required in order to ensure reliability of contact, but in the present structure of fixing the power feeding terminals 10, 10 by welding, implementation of plating treatment of the power feeding terminals 10, 10 by inexpensive materials other than the gold material is sufficient, so that manufacturing cost can be reduced.

Further, the conductive patterns 2a, 2a of the ceramic circuit board 2 are respectively fixed to the power feeding terminals 10, 10 of the attachment 5 for power feeding by welding, so that reliability on energization between both the parts can be improved.

Figure 3:
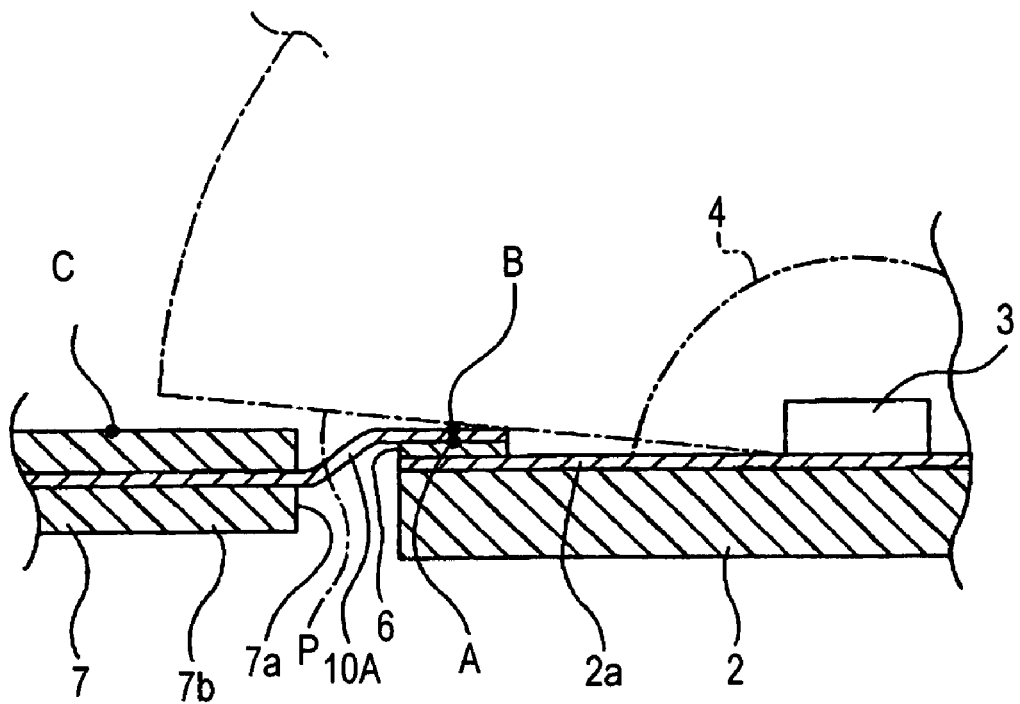
FIG. 3 is a schematic enlarged sectional view showing an example of bending a connection terminal in crank shape.

The flat plate-shaped part which is not bent has been shown above as the power feeding terminals 10, 10 of the attachment 5 for power feeding but, for example, as shown in FIG. 3, power feeding terminals 10A, 10A bent in crank shape so that a portion located to the side of the ceramic circuit board 2 is located upward beyond other portions can also be used.

By thus using the power feeding terminals 10A, 10A bent in crank shape, an upper surface of the plate-shaped part 7b of the attachment 5 for power feeding can be arranged in a low position and an irradiation range of the lower side P of light emitted from the semiconductor light emitting element 3 is increased so that light emission efficiency can be improved.

In addition, as shown in FIG. 3, it is desirably constructed so that when a position in a vertical direction of a lower surface of the portion connected to the metal pad 6 of the power feeding terminal 10A is set as a position A and a position in the vertical direction of an upper surface of the portion connected to the metal pad 6 of the power feeding terminal 10A is set as a position B and a position in the vertical direction of an upper surface of the plate-shaped part 7b of the attachment 5 for power feeding is set as a position C, the position C is preferably present in the same position as the position B or the position C is preferably present in the side of the position A beyond the position B. Light emission efficiency of light emitted from the semiconductor light emitting element 3 can be improved surely by setting the position A, the position B and the position C in such a position relation.

Figure 4:
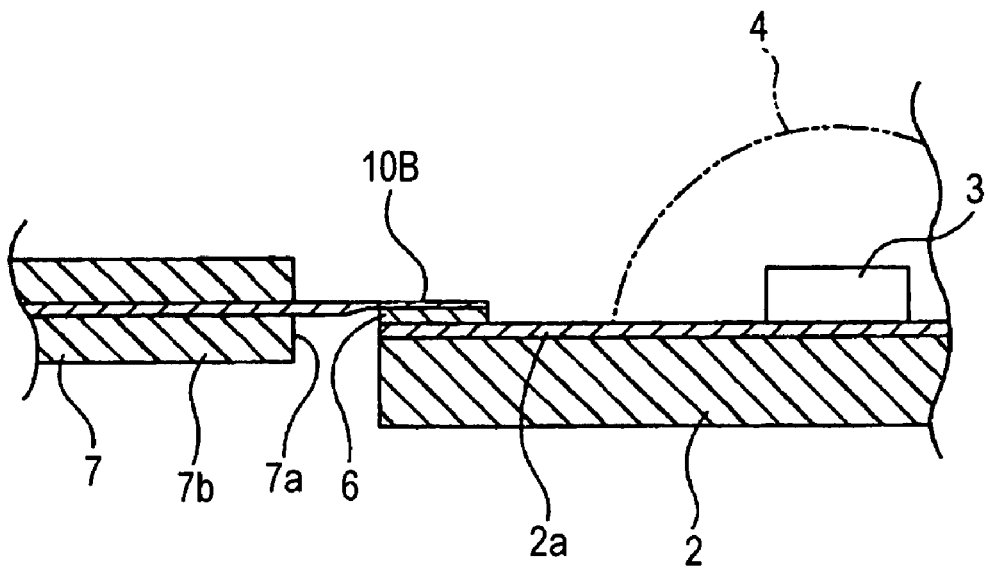
FIG. 4 is a schematic enlarged sectional view showing an example of thinly forming a part of a connection terminal.

Also, power feeding terminals 10B, 10B in which a thickness of the portion connected to the metal pads 6, 6 is formed thinner than a thickness of the other portion can also be used (see FIG. 4). In the case of using the power feeding terminals 10B, 10B, a thickness of the portion other than the portion connected to the metal pads 6, 6 is thick and thereby high rigidity in the portion located inside the base surface part 7 and the protrusion part 8 can be ensured and a thickness of the portion connected to the metal pads 6, 6 is thin and thereby welding can be performed easily.

Figure 5:
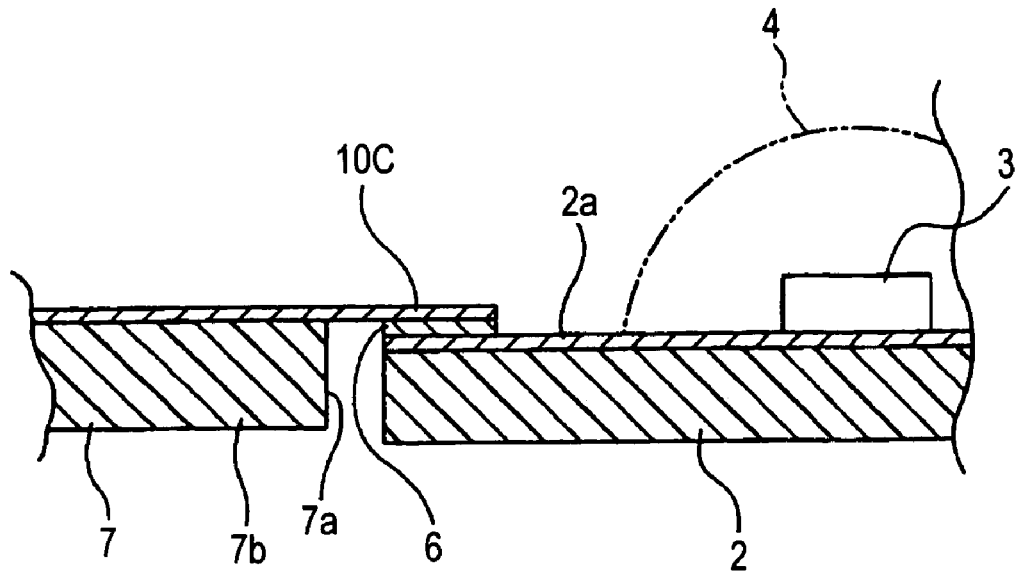
FIG. 5 is a schematic enlarged sectional view showing an example of disposing a connection terminal on an upper surface of an attachment for power feeding.

Further, the power feeding terminals 10, 10A, 10B inward protruded from an inner circumferential surface of the attachment 5 for power feeding have been shown above as the example but, for example, connection terminals 10C, 10C fitted on an upper surface of the attachment 5 for power feeding can also be used (see FIG. 5). In the case of using the power feeding terminals 10C, 10C, an upper surface of the plate-shaped part 7b of the attachment 5 for power feeding can be arranged in a low position without bending the power feeding terminals 10C, 10C in crank shape and an irradiation range of the lower side of light emitted from the semiconductor light emitting element 3 is increased so that light emission efficiency can be improved.

Figure 6:
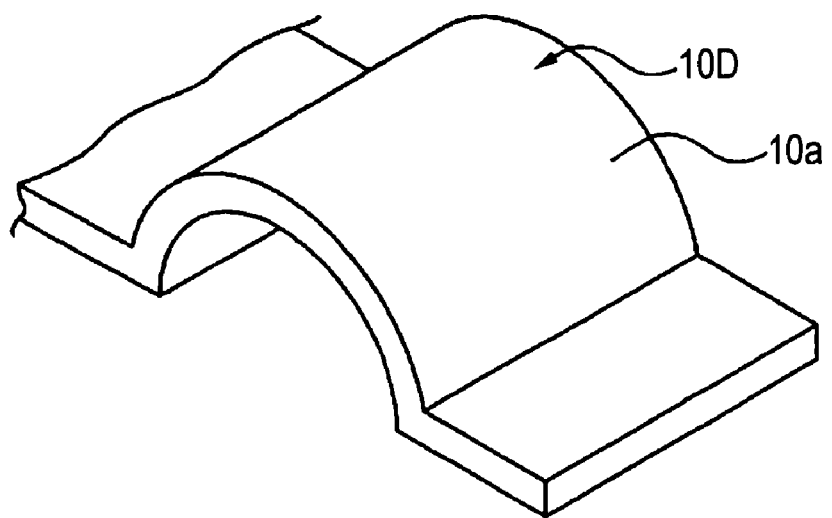
FIG. 6 is an enlarged perspective view showing another example of a connection terminal.

In addition, a shape of the portion protruded from the base surface part 7 in the connection terminal is arbitrary and, for example, a connection terminal 10D having a shape as shown in FIG. 6 can also be used. The connection terminal 10D has a circular arc part 10a bent in circular arc shape in the intermediate part and the portion other than the circular arc part 10a is formed in flat plate shape.

Figure 7:
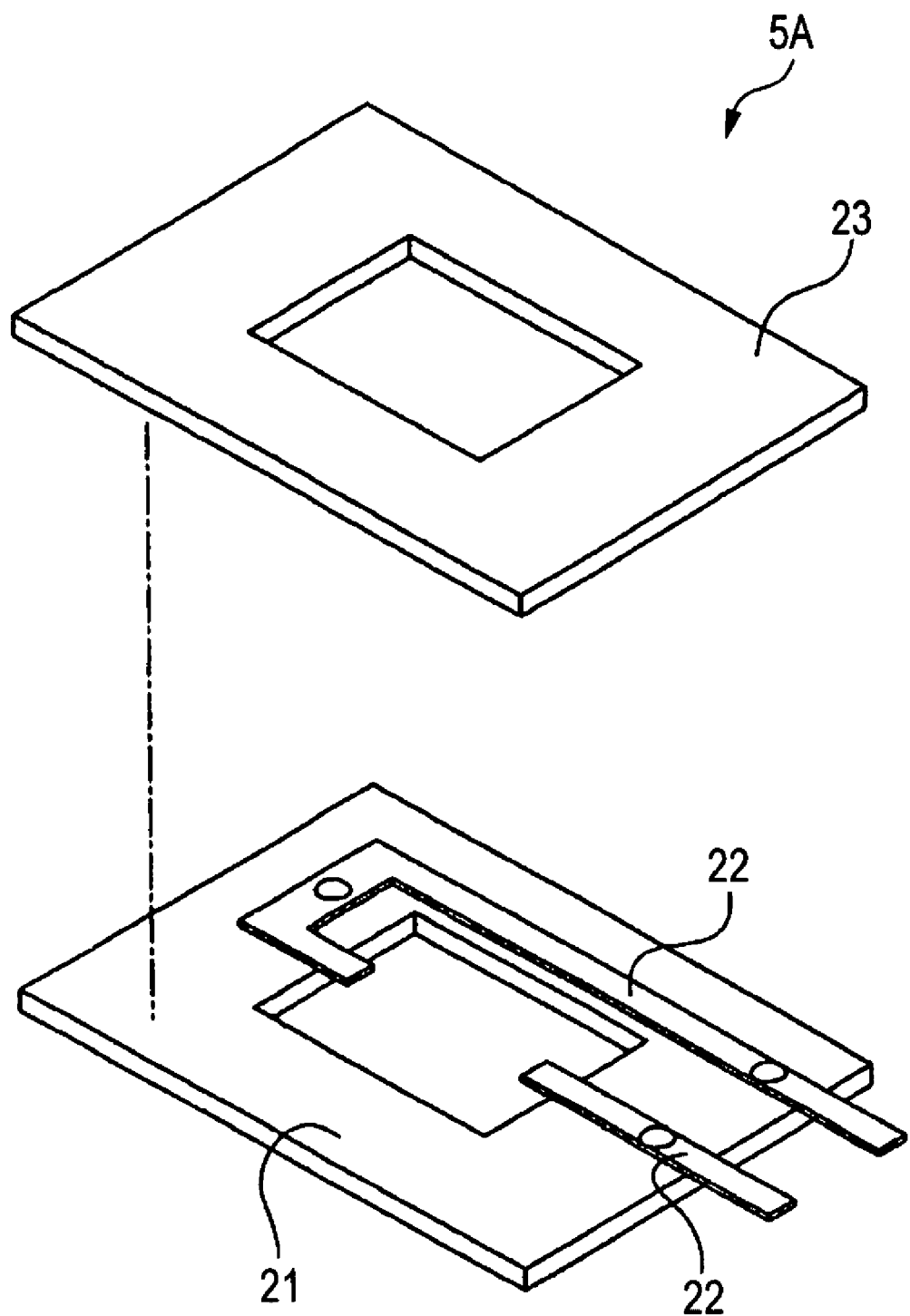
FIG. 7 is a schematic exploded perspective view showing another example of an attachment for power feeding.

The attachment 5 for power feeding in which the base surface part 7, the protrusion part 8, the power feeding parts 9, 9 and the power feeding terminals 10, 10 are integrally formed by insert molding has been shown above as the example, but molding of the attachment for power feeding is not limited to the insert molding and, for example, as shown in FIG. 7, it may be constructed so that metal plates 22, 22 are fixed to an upper surface of a resin member 21 by applied heat clamping and a resin member 23 is bonded to the resin member 21 from the side of the metal plates 22, 22 to construct an attachment 5A for power feeding. In the attachment 5A for power feeding, the resin members 21, 23 are the portions corresponding to the base surface part 7 or the protrusion part 8 of the attachment 5 for power feeding and the metal plates 22, 22 are the portions corresponding to the power feeding parts 9, 9 or the power feeding terminals 10, 10 of the attachment 5 for power feeding.

Figure 8:
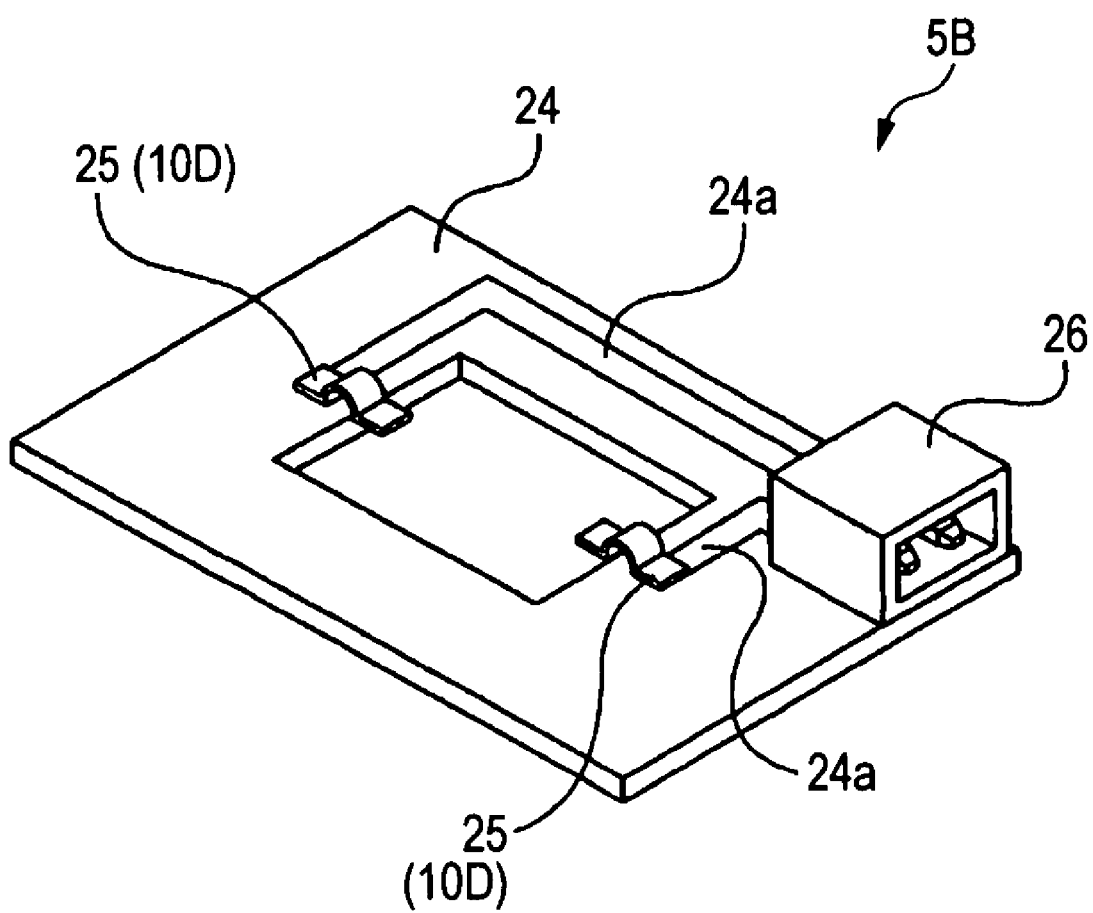
FIG. 8 is a schematic perspective view showing a further example of an attachment for power feeding.

Also, as shown in FIG. 8, it may be constructed so that conductor layers 24a, 24a are formed in a circuit board 24 made of a glass epoxy material, metal terminals 25, 25 are respectively joined to one ends of the conductor layers 24a, 24a, a connector member 26 is joined to the other ends of the conductor layers 24a, 24a and thereby an attachment 5B for power feeding is constructed. As the metal terminals 25, 25, for example, the connection terminals 10D, 10D having the shape as shown in FIG. 6 are used.

In the attachment 5B for power feeding, the circuit board 24 is the portion corresponding to the base surface part 7 or the protrusion part 8 of the attachment 5 for power feeding, the metal terminals 25, 25 and the conductor layers 24a, 24a are the portions corresponding to the power feeding terminals 10, 10 of the attachment 5 for power feeding, and the connector member 26 is the portion corresponding to the power feeding parts 9, 9 of the attachment 5 for power feeding.

Figure 9:
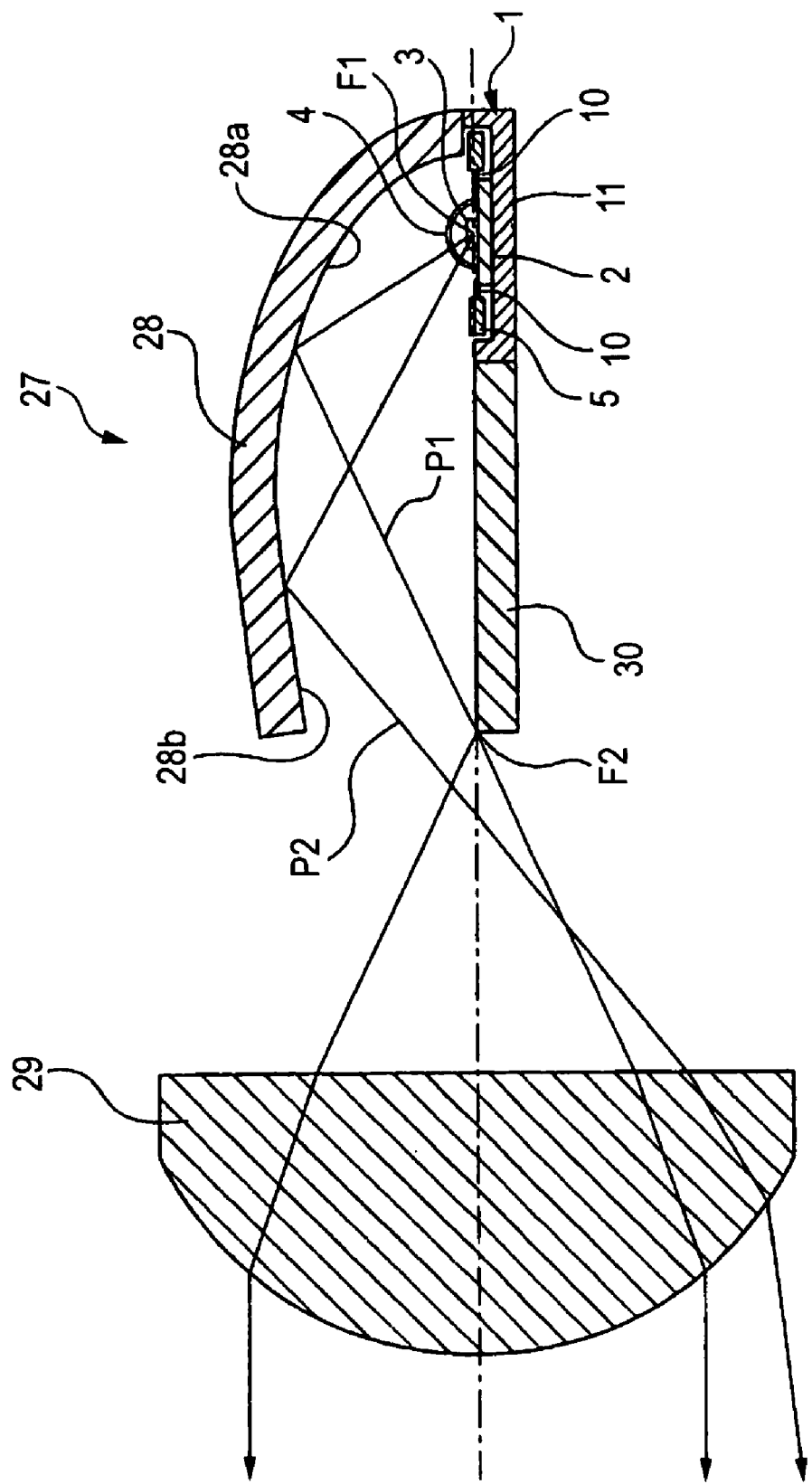
FIG. 9 is a schematic sectional view of a lighting device for vehicle.

Next, a configuration example of a lighting device for vehicle comprising a light source module will be described (see FIG. 9).

A lighting device 27 for vehicle comprises a reflector 28 in which a light source module 1 is arranged inside, and a projection lens 29 for applying light emitted from a semiconductor light emitting element 3 as illumination light. The reflector 28 and the projection lens 29 are arranged inside a lamp housing (not shown) constructed by, for example, a lamp body and a transparent lens.

In addition, when the light source module 1 is used in the lighting device 27 for vehicle, the lighting device 27 for vehicle may be constructed by arranging the reflector 28 in which only one light source module 1 is arranged inside the lamp housing, or the lighting device 27 for vehicle may be constructed by respectively arranging light source modules 1, 1, . . . inside plural reflectors 28, 28, . . . and arranging these plural reflectors 28, 28, . . . inside the lamp housing. In the case of using plural light source modules 1, 1, . . . , luminance of illumination light applied from the lighting device 27 for vehicle can be increased by the number of light source modules 1, 1, . . . and further, flexibility in shape of the lighting device 27 for vehicle can be improved by improving flexibility in arrangement of the light source modules 1, 1, . . . .

The reflector 28 has a first reflective surface 28a located backward and a second reflective surface 28b located in the front of the first reflective surface 28a, and the first reflective surface 28a is formed in an elliptic sphere and the second reflective surface 28b is formed in an inclination surface inclined downward gradually as the surface 28b is located to the front. The semiconductor light emitting element 3 of the light source module 1 is arranged in a first focal point F1 of the first reflective surface 28a.

Inside the reflector 28, for example, a light control member 30 with flat plate shape is arranged and the light source module 1 is arranged in the back of the light control member 30. The front end of the light control member 30 is substantially matched with a second focal point F2 of the first reflective surface 28a of the reflector 28. Therefore, light (light P1 shown in FIG. 9) which is emitted from the semiconductor light emitting element 3 and is reflected by the first reflective surface 28a is converged on the second focal point F2.

A focal point of the projection lens 29 is matched with the second focal point F2. Therefore, light which is emitted from the semiconductor light emitting element 3 and is converged on the second focal point F2 is applied toward the front by the projection lens 29.

Light (light P2 shown in FIG. 9) which is emitted from the semiconductor light emitting element 3 and is reflected by the second reflective surface 28b of the reflector 28 travels toward the front of the second focal point F2 and is passed through the lower end of the projection lens 29 and is applied as illumination light. Therefore, the illumination light passing through the projection lens 29 is applied toward the front as illumination light in which a principal luminous flux reflected by the first reflective surface 28a is combined with an additional luminous flux reflected by the second reflective surface 28b.

All of the structure and the shape of each part shown and described above only show exemplary embodiments, and the technical scope of the invention is not to be construed in a limited way by these specific examples.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF THE REFERENCE NUMERALS AND SIGNS 1 light source module
2 ceramic circuit board
2a conductive pattern
3 semiconductor light emitting element
5 attachment for power feeding
7b plate-shaped part
9 power feeding part
10 power feeding terminal
11 radiator
10A connection terminal
10B connection terminal
10C connection terminal
10D connection terminal
5A attachment for power feeding
5B attachment for power feeding
27 lighting device for vehicle

What is claimed is:

1. A light source module used in a lighting device for vehicle and fitted into a radiator, comprising:
    a ceramic circuit board on which a predetermined conductive pattern is formed,
    a semiconductor light emitting element arranged on said ceramic circuit board and connected to the conductive pattern, and
    an attachment for power feeding bonded to the ceramic circuit board on which said semiconductor light emitting element is arranged,
    wherein said attachment for power feeding is provided with
        a power feeding part connected to an external power source,
        a plate-shaped part comprising an arrangement hole, the inner surface of the arrangement hole surrounding an outer circumferential surface of the ceramic circuit board, and
        a power feeding terminal formed in plate shape and protruded from the plate-shaped part to a side of the ceramic circuit board,
    wherein bottom surface of one end of the power feeding terminal is connected to a top surface of the conductive pattern, overlapping in a thickness direction,
    wherein the power feeding terminal of the attachment for power feeding is fixed and connected to the conductive pattern of the ceramic circuit board by welding, and
    wherein the ceramic circuit board and the plate-shaped part of the attachment for power feeding are formed in a substantially same thickness and the power feeding terminal is protruded from a side surface of the plate-shaped part located opposite to an outer circumferential surface of the ceramic circuit board.

2. A light source module as in claim 1, wherein said power feeding terminal is bent in crank shape in a thickness direction of the ceramic circuit board.

3. A light source module as in claim 1, wherein when a position in a thickness direction of the ceramic circuit board of a surface connected to the conductive pattern of the power feeding terminal is set as a position A and a position in the thickness direction of the ceramic circuit board of a surface opposite to the surface connected to the conductive pattern of the power feeding terminal is set as a position B and a position in the thickness direction of the ceramic circuit board of a surface facing in the same direction as the opposite surface of the plate-shaped part of the attachment for power feeding is set as a position C, the position C is present in the same position as the position B or the position C is present in a side of the position A beyond the position B.

4. A light source module as in claim 1, wherein the plate-shaped part of the attachment for power feeding is formed by a resin material, and said plate-shaped part and the power feeding terminal are formed by integral molding.

5. A light source module as in claim 1, wherein laser welding is used for welding the power feeding terminal of the attachment for power feeding and the conductive pattern of the ceramic circuit board.

6. A lighting device for vehicle in which light emitted from a semiconductor light emitting element of a light source module arranged inside a lamp housing is applied as illumination light by a projection lens, wherein the light source module comprises:
    a ceramic circuit board on which a predetermined conductive pattern is formed, a semiconductor light emitting element arranged on said ceramic circuit board and connected to the conductive pattern, and an attachment for power feeding bonded to the ceramic circuit board on which said semiconductor light emitting element is arranged, wherein said attachment for power feeding is provided with a power feeding part connected to an external power source, a plate-shaped part comprising an arrangement hole, the inner surface of the arrangement hole surrounding an outer circumferential surface of the ceramic circuit board and formed by a resin material, and a power feeding terminal formed in plate shape and protruded from the plate-shaped part to the side of the ceramic circuit board, wherein bottom surface of one end of the power feeding terminal is connected to a top surface of the conductive pattern, overlapping in a thickness direction, wherein the power feeding terminal of the attachment for power feeding is fixed and connected to the conductive pattern of the ceramic circuit board by welding, and wherein the ceramic circuit board and the plate-shaped part of the attachment for power feeding are formed in a substantially same thickness and the power feeding terminal is protruded from a side surface of the plate-shaped part located opposite to an outer circumferential surface of the ceramic circuit board.

7. A light source module as in claim 2, wherein when a position in a thickness direction of the ceramic circuit board of a surface connected to the conductive pattern of the power feeding terminal is set as a position A and a position in the thickness direction of the ceramic circuit board of a surface opposite to the surface connected to the conductive pattern of the power feeding terminal is set as a position B and a position in the thickness direction of the ceramic circuit board of a surface facing in the same direction as the opposite surface of the plate-shaped part of the attachment for power feeding is set as a position C, the position C is present in the same position as the position B or the position C is present in a side of the position A beyond the position B.

8. A light source module as in claim 2, wherein the plate-shaped part of the attachment for power feeding is formed by a resin material, and said plate-shaped part and the power feeding terminal are formed by integral molding.

9. A light source module as in claim 3, wherein the plate-shaped part of the attachment for power feeding is formed by a resin material, and said plate-shaped part and the power feeding terminal are formed by integral molding.

10. A light source module as in claim 7, wherein the plate-shaped part of the attachment for power feeding is formed by a resin material, and said plate-shaped part and the power feeding terminal are formed by integral molding.

11. A light source module as in claim 2, wherein laser welding is used for welding the power feeding terminal of the attachment for power feeding and the conductive pattern of the ceramic circuit board.

12. A light source module as in claim 4, wherein laser welding is used for welding the power feeding terminal of the attachment for power feeding and the conductive pattern of the ceramic circuit board.

13. A light source module as in claim 7, wherein laser welding is used for welding the power feeding terminal of the attachment for power feeding and the conductive pattern of the ceramic circuit board.

14. A light source module as in claim 8, wherein laser welding is used for welding the power feeding terminal of the attachment for power feeding and the conductive pattern of the ceramic circuit board.

15. A light source module as in claim 9, wherein laser welding is used for welding the power feeding terminal of the attachment for power feeding and the conductive pattern of the ceramic circuit board.

16. A light source module as in claim 10, wherein laser welding is used for welding the power feeding terminal of the attachment for power feeding and the conductive pattern of the ceramic circuit board.

17. A method of manufacturing a light source module used in a lighting device for vehicle and fitted into a radiator, the method comprising:

forming a predetermined conductive pattern a ceramic circuit board, arranging a semiconductor light emitting element on said ceramic circuit board, connecting said semiconductor light emitting element to the conductive pattern, bonding an attachment for power feeding to the ceramic circuit board on which said semiconductor light emitting element is arranged, wherein providing said attachment for power feeding comprises connecting a power feeding part to an external power source, forming a plate-shaped part comprising an arrangement hole, the inner surface of the arrangement hole surrounding an outer circumferential surface of the ceramic circuit board, and forming a power feeding terminal in plate shape protruded from the plate-shaped part to a side of the ceramic circuit board, connecting bottom surface of one end of the power feeding terminal to a bottom surface of the conductive pattern, overlapping in from a thickness direction, fixing and connecting the power feeding terminal of the attachment for power feeding to the conductive pattern of the ceramic circuit board by welding, and forming the ceramic circuit board and the plate-shaped part of the attachment for power feeding in a substantially same thickness, wherein the power feeding terminal is protruded from a side surface of the plate-shaped part located opposite to an outer circumferential surface of the ceramic circuit board.

18. The method as claimed in claim 17, further comprising: bending said power feeding terminal in crank shape in a thickness direction of the ceramic circuit board.

19. The method as claimed in claim 17 further comprising: forming the plate-shaped part of the attachment for power feeding by a resin material, and forming said plate-shaped part and the power feeding terminal by integral molding.

20. The method as claimed in claim 17 wherein laser welding is used for welding the power feeding terminal of the attachment for power feeding and the conductive pattern of the ceramic circuit board.

* * * * *